(12) United States Patent
Baumgarten et al.

(10) Patent No.: US 11,842,913 B2
(45) Date of Patent: Dec. 12, 2023

(54) SEAL MECHANISMS FOR LOAD PORTS

(71) Applicant: APPLIED MATERIALS, INC., Santa Clara, CA (US)

(72) Inventors: Douglas B. Baumgarten, Round Rock, TX (US); Paul B. Reuter, Austin, TX (US); James C Hansen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/484,124

(22) Filed: Sep. 24, 2021

(65) Prior Publication Data

US 2023/0094114 A1    Mar. 30, 2023

(51) Int. Cl.
*H01L 21/677* (2006.01)

(52) U.S. Cl.
CPC .. *H01L 21/67766* (2013.01); *H01L 21/67772* (2013.01); *H01L 21/67775* (2013.01)

(58) Field of Classification Search
CPC ......... H01L 21/67772; H01L 21/67775; E06B 7/16; E06B 1/045; E06B 1/6084; E06B 1/64; E06B 2001/622; E06B 3/58; E06B 3/5821; E06B 3/62; E06B 2003/622; E06B 2003/6244; E06B 2003/6247; E06B 5/14; E06B 7/22; E06B 7/23
See application file for complete search history.

(56) References Cited

U.S. PATENT DOCUMENTS

| | | | | |
|---|---|---|---|---|
| 10,727,100 | B2* | 7/2020 | Ochiai | H01L 21/67775 |
| 2001/0038783 | A1* | 11/2001 | Nakashima | H01L 21/67772 414/217 |
| 2008/0008564 | A1* | 1/2008 | Bonora | H01L 21/67772 414/217 |
| 2009/0129897 | A1* | 5/2009 | Babbs | H01L 21/67775 414/217 |
| 2014/0305540 | A1* | 10/2014 | Oyama | H01L 21/67769 141/4 |
| 2015/0194328 | A1* | 7/2015 | Emoto | H01L 21/67772 414/217 |
| 2017/0178942 | A1* | 6/2017 | Sakata | H01L 21/67775 |
| 2018/0130687 | A1* | 5/2018 | Bonecutter | H01L 21/67778 |
| 2020/0194292 | A1* | 6/2020 | Ito | H01L 21/67775 |

* cited by examiner

*Primary Examiner* — Glenn F Myers
(74) *Attorney, Agent, or Firm* — Lowenstein Sandler LLP

(57) ABSTRACT

The disclosure describes devices and systems for a two-sided seal for a load port, and methods for using said seal. A factory interface for an electronic device manufacturing system can include a load port for receiving a substrate carrier. The load port can include a frame adapted for connecting the load port to a factory interface, the frame comprising a transport opening. The load port can also include a seal coupled to the frame. The seal can include a first contact point configured to engage with a load port door when the load port door is in a first position, and configured to disengage with the load port door when the load port door is in a second position and a second contact point configured to engage with a front of a substrate carrier when the substrate carrier is docked on the load port.

19 Claims, 15 Drawing Sheets

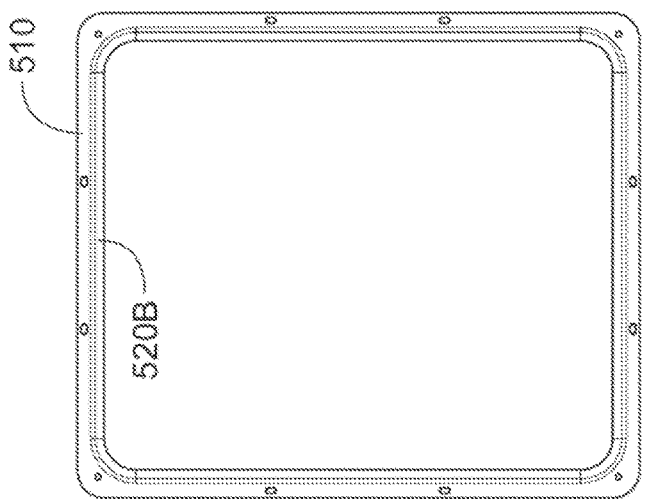
FIG. 5B
FIG. 5C
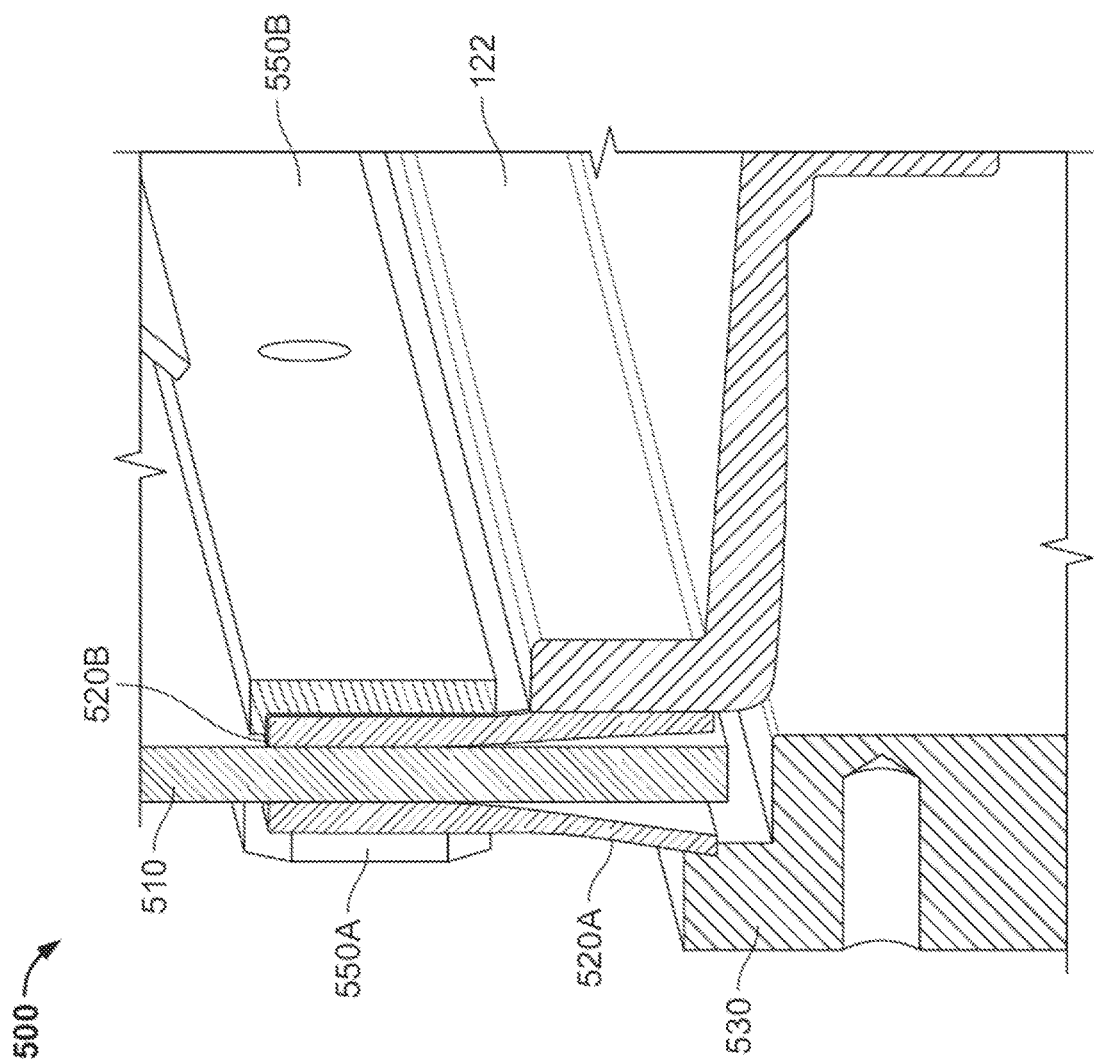
FIG. 5A

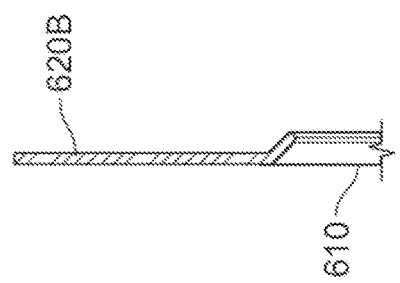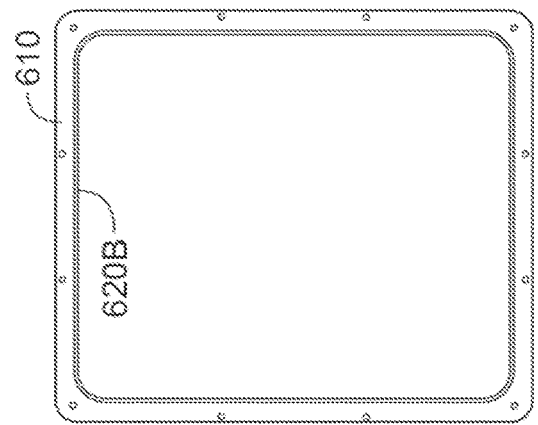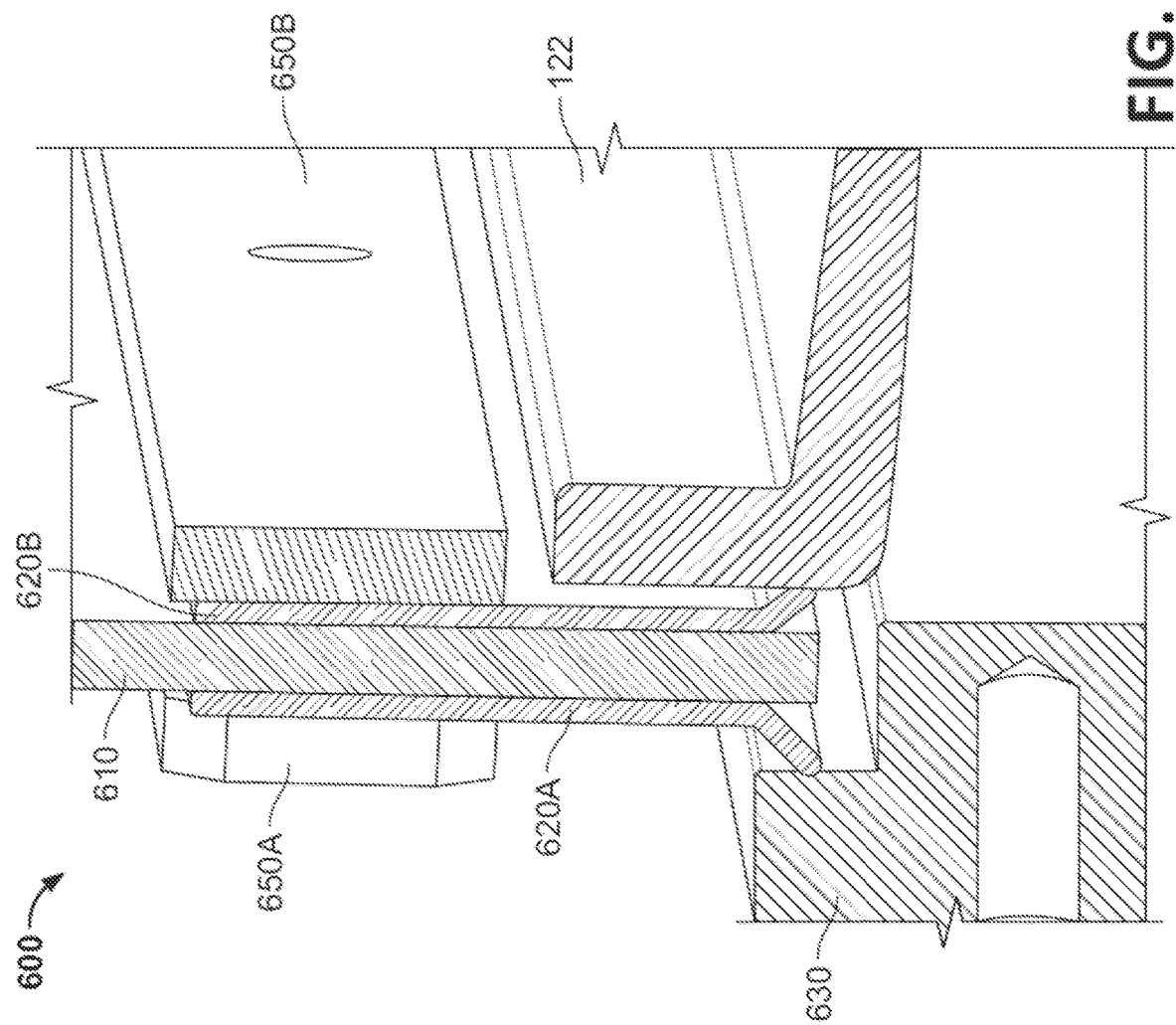

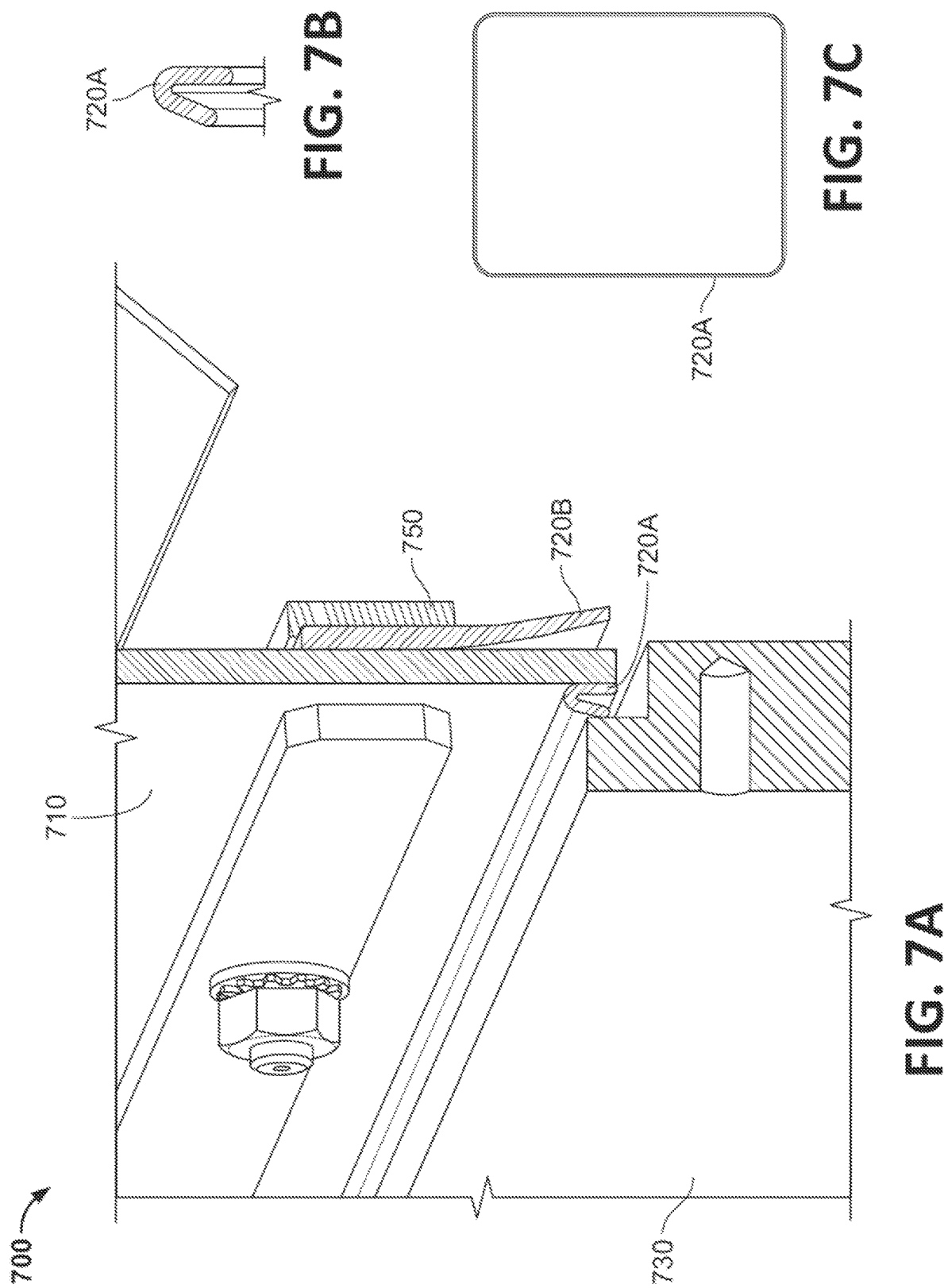

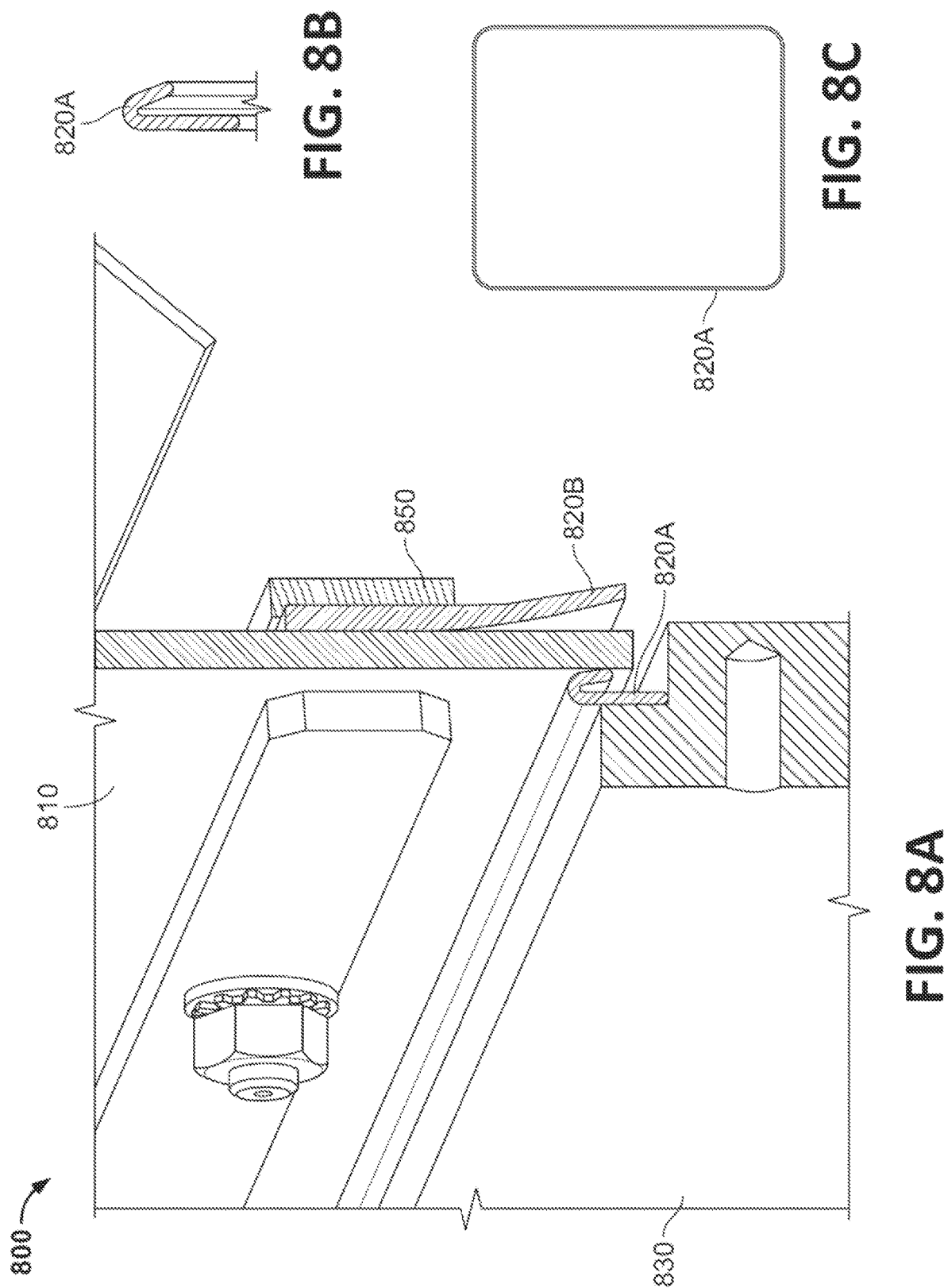

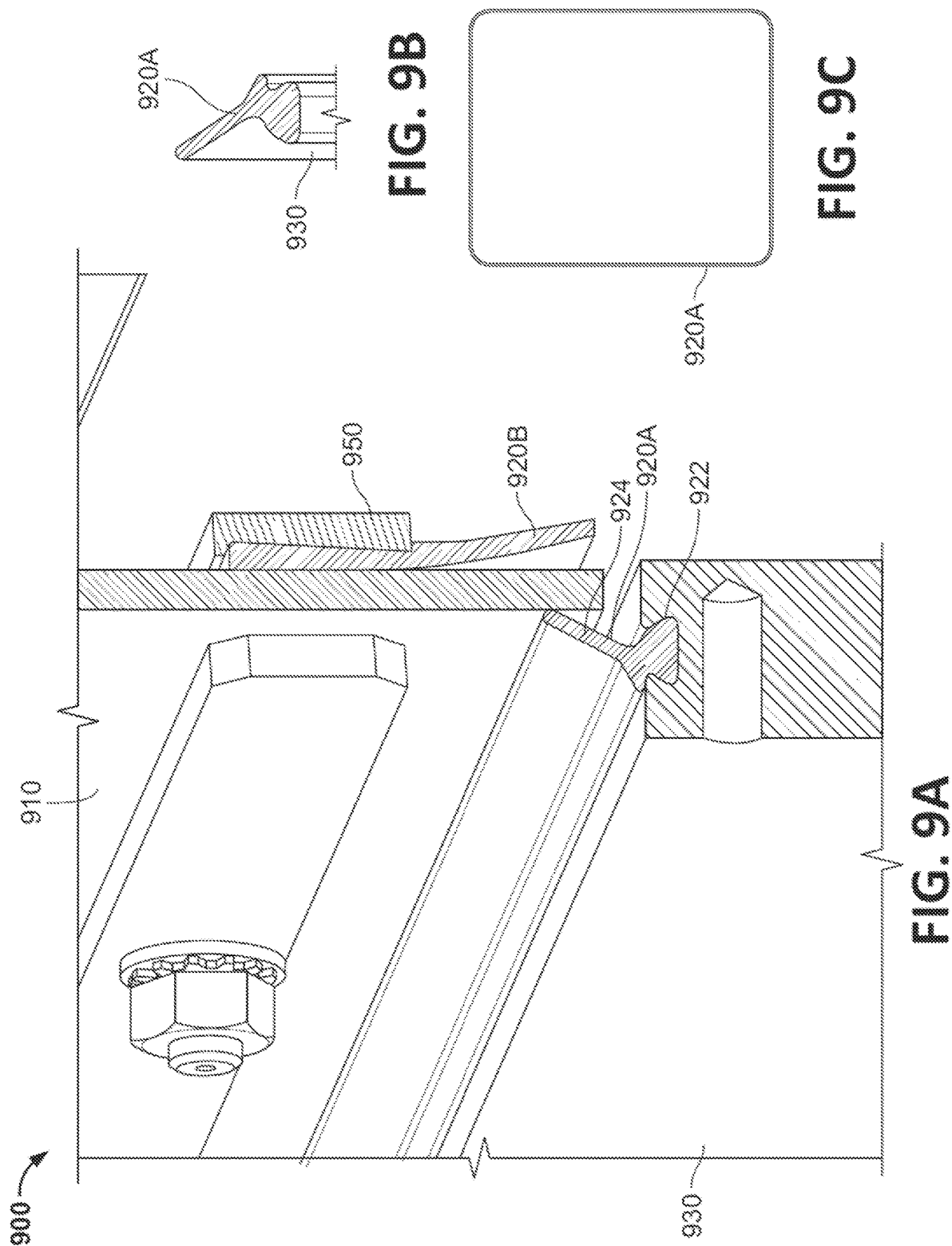

SEAL MECHANISMS FOR LOAD PORTS

TECHNICAL FIELD

Embodiments of the present disclosure relate, in general, to seal mechanisms for a load port.

BACKGROUND

An electronic device manufacturing system can include one or more tools or components for transporting and manufacturing substrates. Such tools or components can include a factory interface connected to a load lock and/or transfer chamber. In some instances, the front face of the factory interface can include one or more load ports. A load port is a station for the input and output of substrate carriers. The load port can include a frame adapted to connect the load port to a factory interface. The frame can include a transport opening through which one or more substrates are capable of being transported between the substrate carrier and the factory interface.

Current load ports generally don't include seals on either side of the frame. Some load ports may include a hollow o-ring positioned between the frame and substrate carrier. The hollow o-ring can be used to aid in maintaining an environmentally-controlled atmosphere within the factory interface. However, such a configuration can be inefficient because current systems require a large amount of compression force, applied by the load port door and the substrate carrier to maintain the environmentally-controlled atmosphere. Accordingly, improved load ports for electronic device manufacturing systems having improved seal mechanisms are sought.

SUMMARY

Some of the embodiments described covering a load port for receiving a substrate carrier. The load port can include a frame adapted to connect the load port to a factory interface. The frame can include a transport opening through which one or more substrates are transported between the substrate carrier and the factory interface. The load port can include a seal coupled to the frame. The seal can include a first contact point configured to engage with a load port door when the load port door is in a first position, and configured to disengage with the load port door when the load port door is in a second position. The seal can further include a second contact point configured to engage with a front of a substrate carrier when the substrate carrier is docked on the load port.

In some embodiments, a load port for receiving a substrate carrier includes a frame adapted for connecting the load port to a factory interface, the frame comprising a transport opening through which one or more substrates are transported between the substrate carrier and the factory interface. The load port further includes a first seal coupled to the frame, wherein the first seal comprises a first contact point configured to engage with a load port door when the load port door is in a first position, and configured to disengage with the load port door when the load port door is in a second position. The load port further includes a second seal coupled to the frame, wherein the second seal comprises a second contact point configured to engage with a front of a substrate carrier when the substrate carrier is docked on the load port.

In some embodiments, a load port for receiving a substrate carrier includes a frame adapted for connecting the load port to a factory interface, the frame comprising a transport opening through which one or more substrates are capable of being transported between the substrate carrier and the factory interface. The load port further includes a first seal coupled to a load port door, wherein the first seal comprises a first contact point configured to engage with the frame when the load port door is in a first position, and configured to disengage with the frame when the load port door is in a second position. The load port further includes a second seal coupled to the frame, wherein the second seal comprises a second contact point configured to engage with a front of a substrate carrier when the substrate carrier is docked on the load port In some embodiments, a method for transporting substrates from a substrate carrier to a factory interface includes receiving, by a load port, a substrate carrier. The load port includes a frame adapted to connect the load port to a factory interface. The frame can include a transport opening through which one or more substrates are capable of being transported between the substrate carrier and the factory interface. The load port can include a seal coupled to the frame. The seal can include a first contact point configured to engage with a load port door when the load port door is in a first position, and configured to disengage with the load port door when the load port door is in a second position. The seal can further include a second contact point configured to engage with a front of a substrate carrier when the substrate carrier is coupled to the load port. The method can further include positioning the substrate carrier such that a front of the substrate carrier engages with the second contact point to form an airtight seal and positioning the load port door from the first position to the second position, using an actuator, such that the load port door disengages from the first contact point. The method can further include retrieving, by a factory interface robot deposed within the factory interface, a substrate from the substrate carrier.

Some of the embodiments described cover a two-sided seal for a load port. The seal can include a top portion adapted for connecting a frame of the load port. The seal can further include a middle portion comprising a first contact point, wherein the first contract point is at a bend of the seal and configured to engage with a face of a substrate carrier. The seal can further include a lower portion comprising a second contact point, wherein the second contact point is an outer edge of the seal configured to engage with a load port door of the load port.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 5A is an isometric schematic view of another example load port frame and seal assembly, according to aspects of the present disclosure.

FIG. 5B is a side view of another example load port frame and seal assembly, according to aspects of the present disclosure.

FIG. 5C is a front view of another example load port frame and seal assembly, according to aspects of the present disclosure.

FIG. 6A is an isometric schematic view of another example load port frame and seal assembly, according to aspects of the present disclosure.

FIG. 6B is a side view of another example load port frame and seal assembly, according to aspects of the present disclosure.

FIG. 6C is a front view of another example load port frame and seal assembly, according to aspects of the present disclosure.

FIG. 7A is an isometric schematic view of another example load port frame and seal assembly, according to aspects of the present disclosure.

FIG. 7B is a side view of another example load port frame and seal assembly, according to aspects of the present disclosure.

FIG. 7C is a front view of another example load port frame and seal assembly, according to aspects of the present disclosure.

FIG. 8A is an isometric schematic view of another example load port frame and seal assembly, according to aspects of the present disclosure.

FIG. 8B is a side view of another example load port frame and seal assembly, according to aspects of the present disclosure.

FIG. 8C is a front view of another example load port frame and seal assembly, according to aspects of the present disclosure.

FIG. 9A is an isometric schematic view of another example load port frame and seal assembly, according to aspects of the present disclosure.

FIG. 9B is a side view of another example load port frame and seal assembly, according to aspects of the present disclosure.

FIG. 9C is a front view of another example load port frame and seal assembly, according to aspects of the present disclosure.

DETAILED DESCRIPTION OF EMBODIMENTS

Figure 1A:
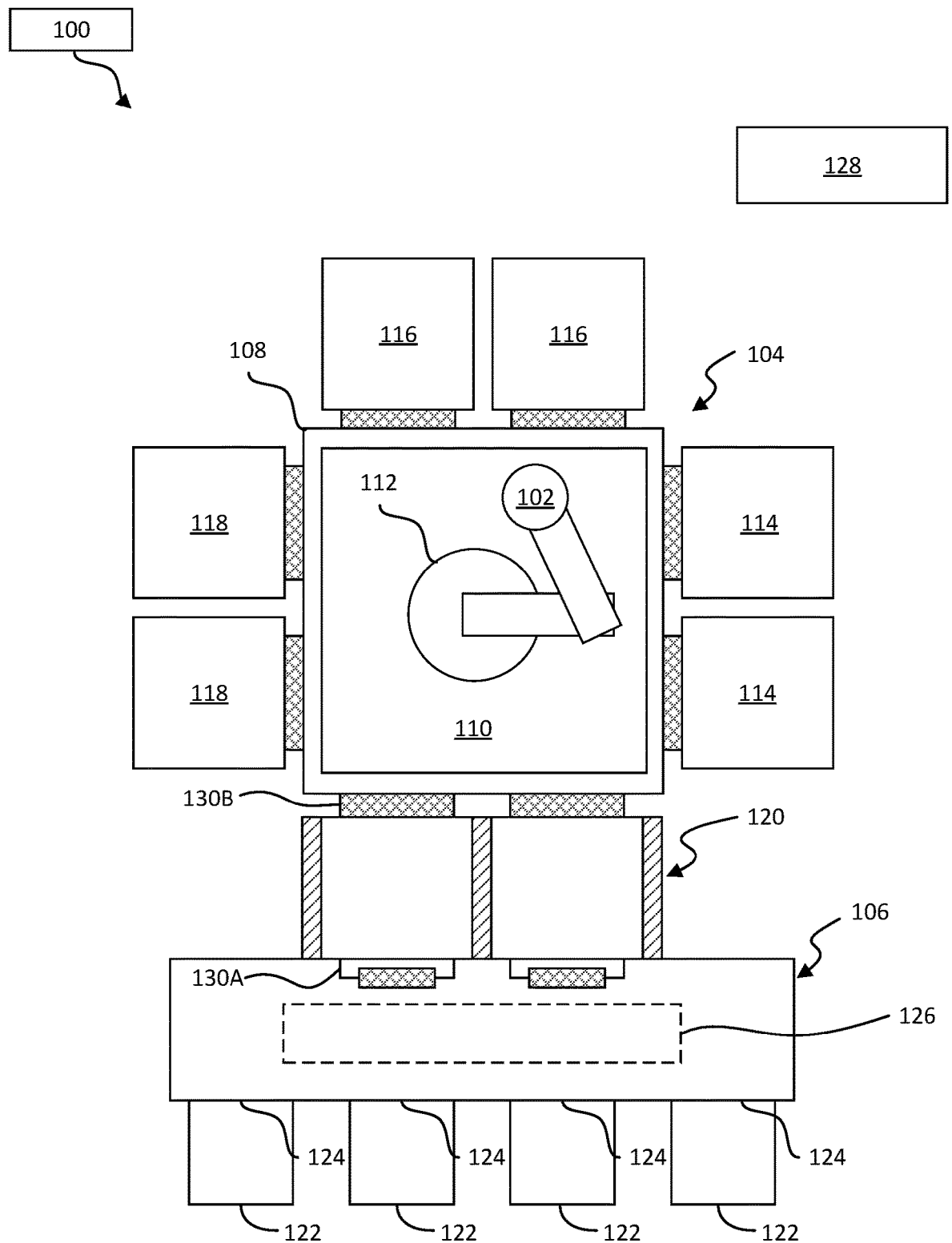
FIG. 1A is a top schematic view of an example electronic device manufacturing system, according to aspects of the present disclosure.

Embodiments described herein cover systems and methods related to seals for load ports. Some embodiments are also directed to a two-sided seal for load ports. Other embodiments are directed to systems with dual seals, a first seal between the load port frame and the load port door, and a second seal between the load port frame and a substrate carrier. In some embodiments, the load port includes a frame adapted to connect the load port to a factory interface. The frame includes a transport opening through which one or more substrates are transported between a substrate carrier and the factory interface. The load port is coupled to a load port door on the factor interface side of frame. The load port door is coupled to a door mechanism (e.g., an actuator operated by a load port controller) capable of sealing the transport opening. The door mechanism can position the load port door from a closed position to an open position, and vice versa.

The frame includes a seal positioned around the transport opening (e.g., the inner perimeter of the frame). In some embodiments, the geometry of the seal is such that one side of the seal contacts with the load port door (responsive to the load port door being in the closed position) and the other side of the seal contacts to the face of the substrate carrier in a docked position on the load port. As such, the seal provides a sealing function, in a single assembly, for both the load port door and the substrate carrier. In some embodiments the seal is designed in an "S" shape, when the top portion of the seal is coupled to the frame, the middle portion of the seal is configured to engage with the face of the substrate carrier, and the lower portion of the seal is configured to engage with the load port door. In other embodiments, the middle portion of the seal is configured to engage with the load port door, and the lower portion of the seal is configured to engage with the face of the substrate carrier.

In some embodiments, systems with dual seals are utilized, where a first seal is positioned between the load port frame and the load port door, and a second seal is positioned between the load port frame and a substrate carrier. In some embodiments, both seals can be affixed to the load port frame. In other embodiments, the first seal can be affixed (e.g., bonded, via a dovetail attachment mechanism, etc.) to the load port door. Accordingly, when the load port door is positioned into a closed position, the first seal can maintain the environmentally-controlled atmosphere in the factory interface. In some embodiments the first seal and/or the second can be a "bent line" shape or a "v" shape, where a first portion of the seal is coupled to the frame, and a second portion of the seal is configured to engage, via a contact point, with the face of the substrate carrier or the load port door.

In some embodiments, the seal geometry allows for a reduction in force, applied by the load port door and/or by the face of the substrate carrier, to maintain the environmentally-controlled atmosphere, as compared to traditional load port seals. In particular, a traditional load port seal may include an o-ring seal, a lip seal, or any other similar apparatus coupled to the frame (or within a groove) on each side of the frame. This assembly requires a high compression force to be exerted by the load port door and the face of the substrate carrier, and/or require an additional mechanism (e.g., a clamping mechanism) to maintain the environmentally-controlled atmosphere. For example, once the substrate carrier is positioned onto the base of the load port, clamping mechanisms can be engaged to apply the required amount of compression force between the face of the substrate carrier and the frame. In addition, traditional load ports can require the frame to be fabricated using expensive machined parts rather than cheaper manufacturing methods, such as sheet metal.

By providing a system that utilized the two-side seal or the dual seals of the present disclosure, load ports doors and substrate carriers can be required to exert less compression force to maintain the environmentally-controlled atmosphere than, for example, load ports with traditional seals. This enables for fabricating the frame from relatively cheaper material, increased service life of the seal, the removal of the clamping mechanisms, and less powerful actuators coupled to the load port doors. This, in turn, can reduce the material, design, and shipping costs associated with electronic device manufacturing systems. In addition, the two-side seal of the present disclosure enables sealing at the lip of the frame, rather than at the above the lip of the frame, as is the case with traditional load ports. This, in turn, can enable sealing in load ports requiring tight space constraints.

Figure 1B:
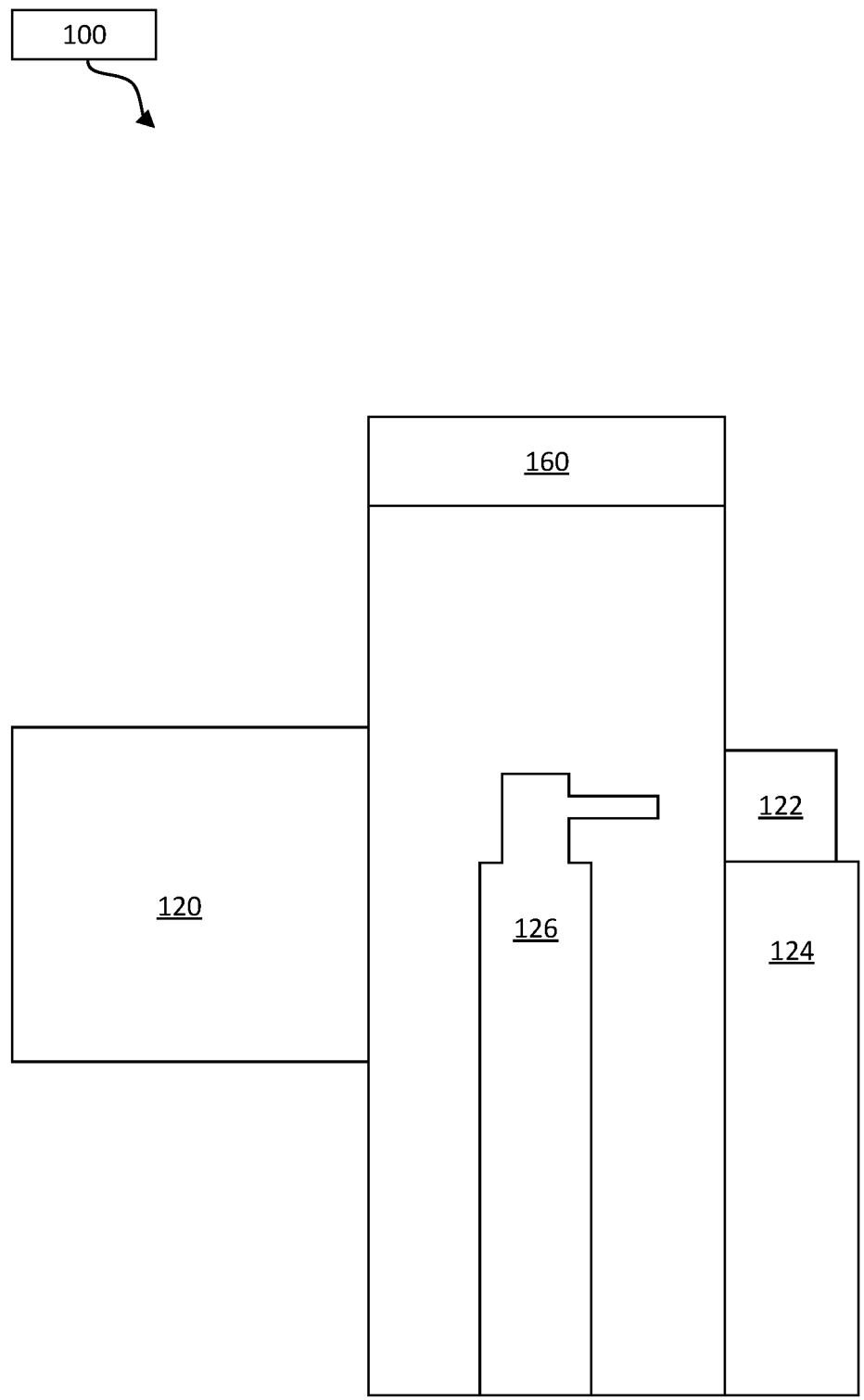
FIG. 1B is a side schematic view of an example electronic device manufacturing system, according to aspects of the present disclosure, according to aspects of the present disclosure.
Figure 1C:
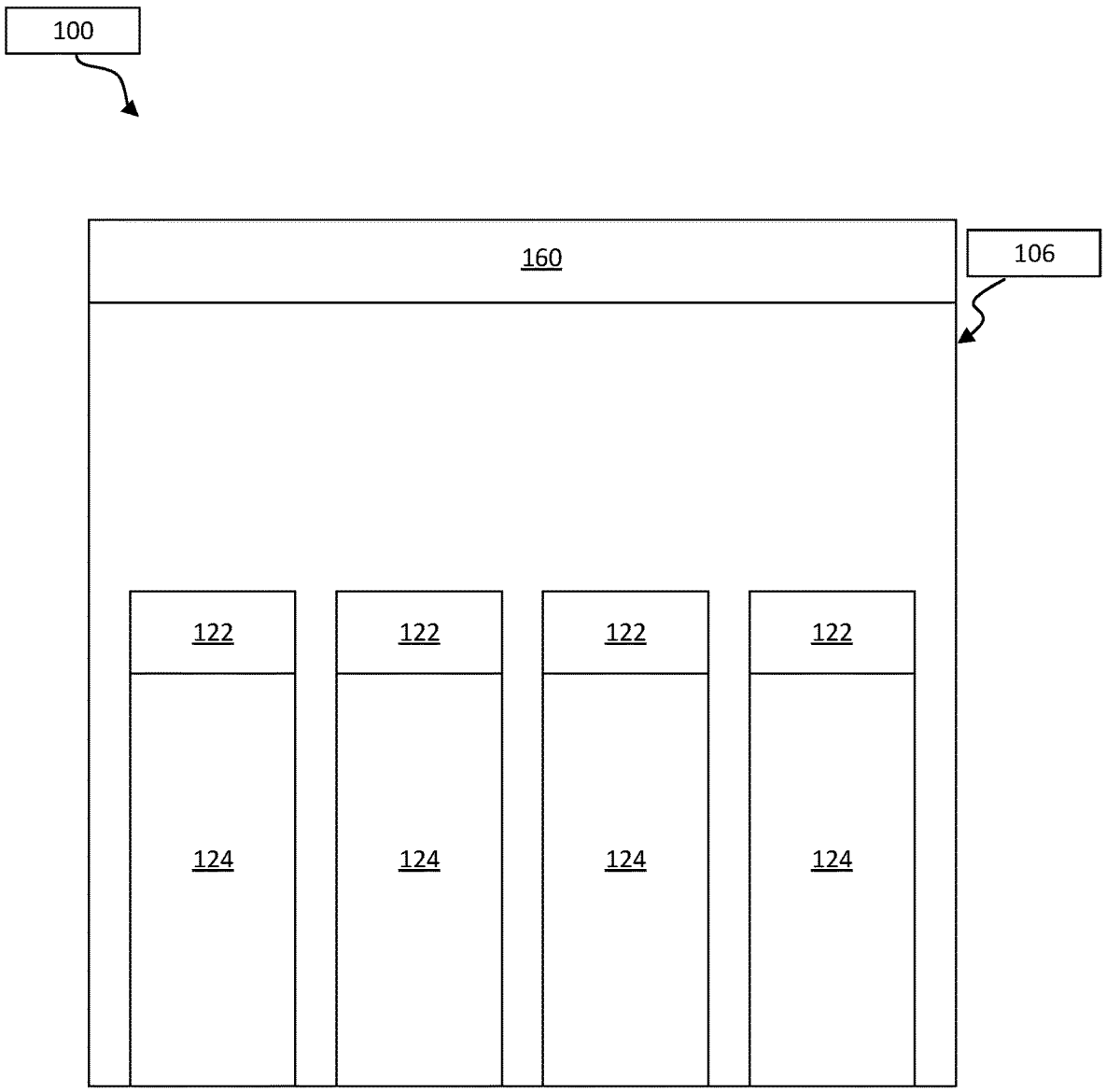
FIG. 1C is a front schematic view of an example electronic device manufacturing system, according to aspects of the present disclosure.

FIGS. 1A-1C describes an electronic device manufacturing system 100 where one or more load ports are coupled to a factory interface 106. FIG. 1A is a top schematic view of the example electronic device manufacturing system 100, according to aspects of the present disclosure. FIG. 1B is a side schematic view of the example electronic device manufacturing system 100, according to aspects of the present disclosure. FIG. 1C is a front schematic view of the example electronic device manufacturing system 100, according to aspects of the present disclosure. It is noted that FIGS. 1A-1C are used for illustrative purposes, and that different component can be positioned in different location in relation to each view.

Electronic device manufacturing system 100 (also referred to as an electronics processing system) is configured to perform one or more processes on a substrate 102. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Electronic device manufacturing system 100 includes a process tool (e.g., a mainframe) 104 and a factory interface 106 coupled to process tool 104. Process tool 104 includes a housing 108 having a transfer chamber 110 therein. Transfer chamber 110 includes one or more processing chambers (also referred to as process chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of process chambers 114, an etching process is performed in one or both of process chambers 116, and an annealing process is performed in one or both of process chambers 118. Other processes can be carried out on substrates therein. Processing chambers 114, 116, 118 can each include a substrate support assembly. The substrate support assembly can be configured to hold a substrate in place while a substrate process is performed.

Transfer chamber 110 also includes a transfer chamber robot 112. Transfer chamber robot 112 can include one or multiple arms where each arm includes one or more end effectors at the end of each arm. The end effector can be configured to handle particular objects, such as wafers. Alternatively, or additionally, the end effector is configured to handle objects such as process kit rings. In some embodiments, transfer chamber robot 112 is a selective compliance assembly robot arm (SCARA) robot, such as a 2-link SCARA robot, a 3-link SCARA robot, a 4-link SCARA robot, and so on.

A load lock 120 can also be coupled to housing 108 and transfer chamber 110. Load lock 120 can be configured to interface with, and be coupled to, transfer chamber 110 on one side and factory interface 106 on another side. Load lock 120 can have an environmentally-controlled atmosphere that is changed from a vacuum environment (where substrates are transferred to and from transfer chamber 110) to an at or near atmospheric-pressure inert-gas environment (where substrates are transferred to and from factory interface 106) in some embodiments. In some embodiments, load lock 120 is a stacked load lock having a pair of upper interior chambers and a pair of lower interior chambers that are located at different vertical levels (e.g., one above another). In some embodiments, the pair of upper interior chambers are configured to receive processed substrates from transfer chamber 110 for removal from process tool 104, while the pair of lower interior chambers are configured to receive substrates from factory interface 106 for processing in process tool 104. In some embodiments, load lock 120 are configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers (also referred to as containers) 122 and load lock 120. In other and/or similar embodiments, factory interface 106 is configured to receive replacement parts from replacement parts storage containers. Factory interface robot 126 can include one or more robot arms and can be or include a SCARA robot. In some embodiments, factory interface robot 126 has more links and/or more degrees of freedom than transfer chamber robot 112. Factory interface robot 126 can include an end effector on an end of each robot arm. The end effector can be configured to pick up and handle specific objects, such as wafers. Alternatively, or additionally, the end effector can be configured to handle objects such as process kit rings. Any conventional robot type can be used for factory interface robot 126. Transfers can be carried out in any order or direction. Factory interface 106 can be maintained in, e.g., a slightly positive-pressure non-reactive gas environment (using, e.g., nitrogen, other inert gasses, or air with controlled sub-component parameters as the non-reactive gas) in some embodiments.

Factory interface 106 can be configured with any number of load ports 124, which can be located at one or more sides of the factory interface 106 and at the same or different elevations. One or more load ports 124 can be of a design that include a two-sided seal, according to aspects of the present disclosure. These load ports will be discussed in greater detail with respect to FIGS. 2A-2C, 3A-3B, and 4A-4D.

Factory interface 106 can include one or more auxiliary components (not shown). The auxiliary components can include substrate storage containers, metrology equipment, servers, air conditioning units, etc. A substrate storage container can store substrates and/or substrate carriers (e.g., FOUPs), for example. Metrology equipment can be used to determine property data of the products that were produced by the electronic device manufacturing system 100. In some embodiments, factory interface 106 can include upper compartment 160, as seen in FIGS. 1B-1C. Upper compartment 160 can house electronic systems (e.g., servers, air conditioning units, etc.), utility cables, system controller 128, or other components.

In some embodiments, transfer chamber 110, process chambers 114, 116, and 118, and/or load lock 120 are maintained at a vacuum level. Electronics processing system 100 can include one or more vacuum ports that are coupled to one or more stations of electronic device manufacturing system 100. For example, first vacuum ports 130a can couple factory interface 106 to load locks 120. Second vacuum ports 130b can be coupled to load locks 120 and disposed between load locks 120 and transfer chamber 110.

In some embodiments, one or more utility lines (not shown) are configured to provide utilities to factory interface 106. The utility lines can include a power utility line configured to provide power to factory interface 106, an air utility line configured to provide air to factory interface 106 (e.g., a clean dry air (CDA) utility line), a vacuum utility line configured to provide a vacuum to first vacuum ports 130a and/or to the interior chamber of the factory interface 106, and/or an inert gas utility line configured to provide inert gasses to factory interface 106.

One of more utility cables can be configured to protect the one or more utility lines. For example, each utility line can be enclosed within a utility cable. Multiple utility lines can be enclosed within the same utility cable and/or utility lines can be included within separate utility cables. A first end of each utility cable can be mounted to an outlet of a utility supply (e.g., a power supply, an air supply, a vacuum pump, an inert gas supply, etc.). In some embodiments, the outlet of a utility supply is connected to the floor (or a wall) of electronic device manufacturing system 100. As such, the first end of each utility cable can be mounted to the ground of the fab (e.g., the ground over which the factory interface 106 is installed). A second end of each utility cable can be mounted to an inlet of factory interface 106. In some embodiments, the inlet is located at a bottom of factory interface 106. As such, the second end of each utility cable is mounted to the bottom of factory interface 106.

Electronic device manufacturing system 100 can also include a system controller 128. System controller 140 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). System controller 128 can include an environmental controller configured to control an environment (e.g., pressure, moisture level, vacuum level, etc.) within factory interface 106. In embodiments, execution of the instructions by system controller 128 causes system controller to perform the methods of one or more of FIG. 5. System controller 140 can also be configured to permit entry and display of data, operating commands, and the like by a human operator.

Figure 2A:
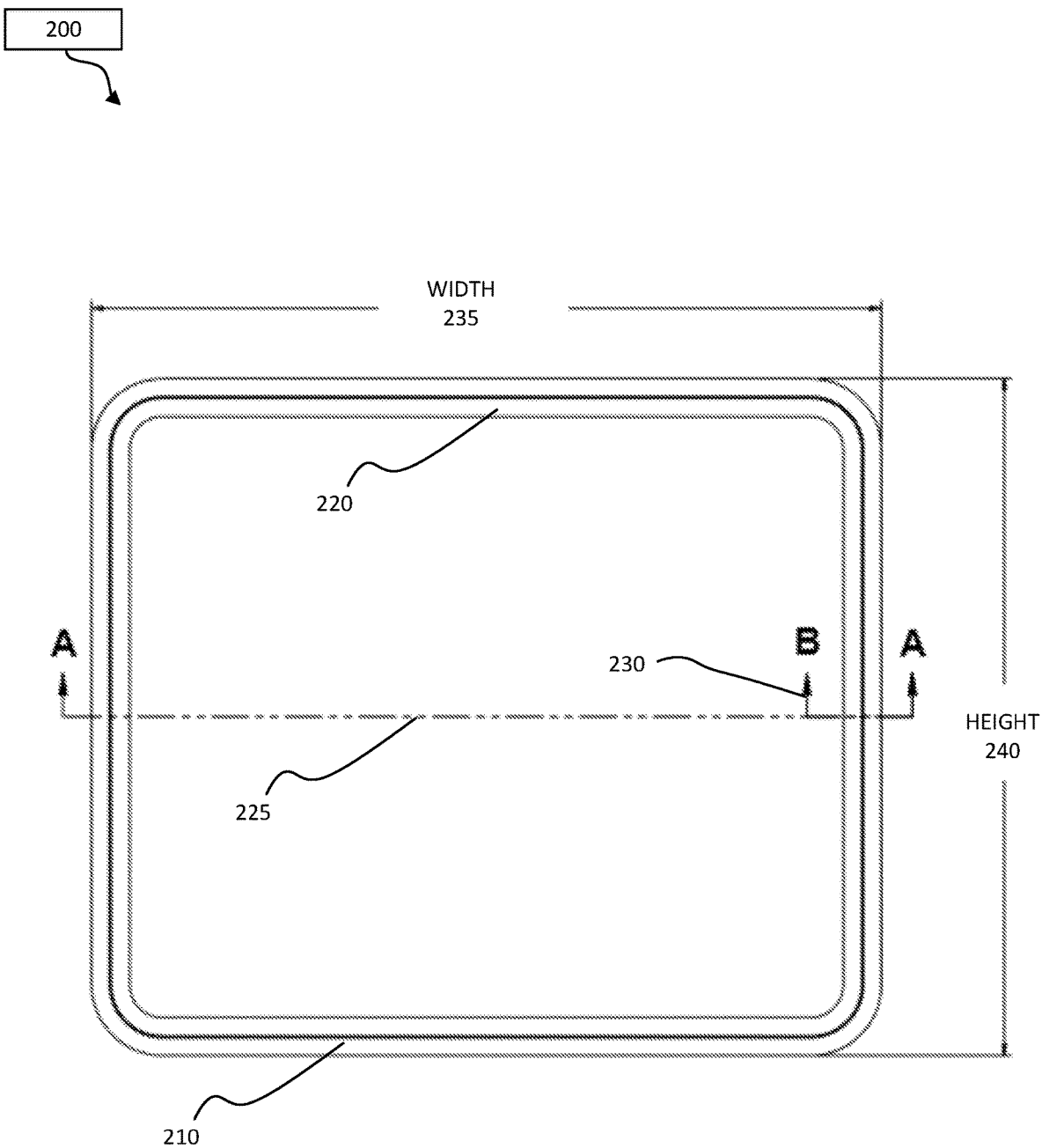
FIG. 2A is a front schematic view of an example load port frame and seal assembly, according to aspects of the present disclosure.
Figure 2B:
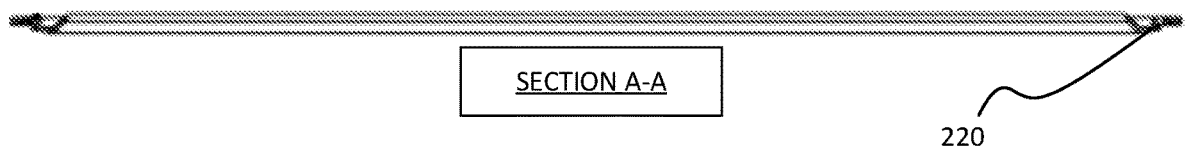
FIG. 2B is a cross section view of an example load port frame and seal assembly, according to aspects of the present disclosure.
Figure 2C:
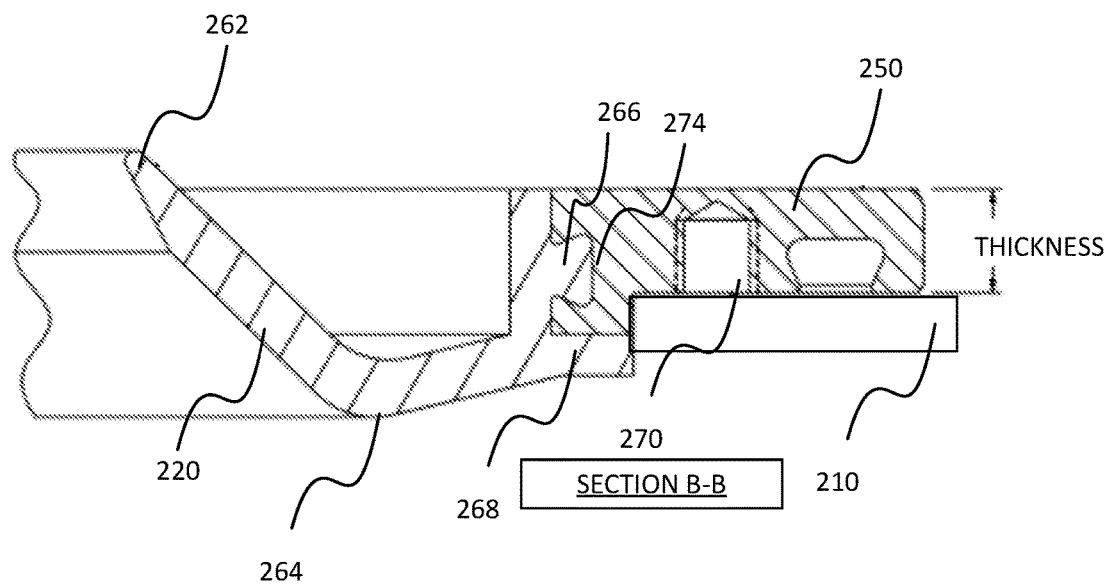
FIG. 2C is a cross section view of an example load port frame and seal assembly, according to aspects of the present disclosure.

FIGS. 2A-2C illustrate an example load port frame and seal assembly 200, in accordance with embodiments of the present disclosure. FIG. 2A is a front schematic view of assembly 200, in accordance with one embodiment of the present disclosure. The assembly 200 can be included in a load port frame 210. The exterior of the load port frame 210 can be of a width 235 and a height 240. In some embodiments, the exterior of the load port frame 210 (or any other load port frame discussed herein) can comply with SEMI (Semiconductor Equipment and Materials International) standards and requirements.

A load port door (not shown) can be positioned in closed position to secure to a transport opening (e.g., the inner parameter of the load port frame 210) to maintain an environmentally-controlled atmosphere in the factory interface 106. The load port door can be positioned in open position using a door mechanism. While in the open position, the transport opening in the assembly 200 enables substrates (e.g., wafers) to be transferred between a substrate carrier 122 coupled to the load port 124 and factory interface 106 using factory interface robot 126.

Seal 220 can be positioned around the transport opening. In some embodiments, the geometry of the seal is such that one side of the seal contacts with the load port door (responsive to the load port door being in the closed position) and the other side of the seal contacts to the face of the substrate carrier 122 in a docked position on the load port 124.

In some embodiments, seal 220 is a single piece of material, such as, for example, vulcanized rubber or any other type of elastomer. Those skilled in the art would understand that other suitable materials can be used, such as, for example, natural rubbers, silicone, plastics, other synthetic rubbers, polymers, etc. In some embodiments, seal 220 can be composed of multiple components coupled together.

FIG. 2B is a cross section view as indicated by A-A 225 in FIG. 2A. Cross section view A-A 225 illustrates a side schematic view of the assembly 200 and seal 220. FIG. 2C is a cross section view as indicated by B-B 230 in FIG. 2C. Cross section view B-B 230 illustrates the side schematic view of seal 220 and coupling 250. Seal 220 can include contact point 262, contact point 264, protrusion 266, and brace 268. Coupling 250 can include bore 270, notch 272, and notch 274.

Coupling 250 can be any type of connection device or mechanism used to couple seal 220 to load port frame 210. Coupling 250 can span the perimeter of load port frame 210. Coupling 250 can be affixed to load port frame 210 via one or more bolts, screws, rivets, or any other type of fastener.

For example, coupling 250 can be affixed to the load port frame 210 using multiple bolts inserted through drilled holes in the load port frame 210 and into respective bores 270. In some embodiments, coupling 250 can be welded, fused, bonded, etc. to load port frame 210. In the embodiment shown, coupling 250 is affixed to the load port frame 210 on the factory interface side of the load port frame 210. However, in other embodiments, coupling 250 can be affixed to the load port frame 210 on the opposite side of load port frame 210.

Seal 220 can be attached to coupling 250 via protrusion 266 and brace 268. In some embodiments, as shown in FIG. 2C, protrusion 266 can be have an expanding or mushroom shape and be inserted into notch 274. Brace 268 can have contact with coupling 250 to provide additional support to seal 220 to prevent seal 220 from displacing when experiencing force from the load port door and/or substrate carrier. Protrusion 266 and brace 268 can span the entire perimeter of seal 220 and coupling 250, respectively. Notch 274 can span the entire perimeter of coupling 250.

In some embodiments seal 220 is designed in an "S" shape, when the top portion of seal 220 is coupled to the frame, the middle portion of the seal is configured to engage with the face of the substrate carrier, and the lower portion of the seal 220 is configured to engage with the load port door. In other embodiments, the middle portion of seal 220 is configured to engage with the load port door, and the lower portion of seal 220 is configured to engage with the face of the substrate carrier. In some embodiments, contact point 262 is an outer edge of the seal, and contact point 264 is at a bend or elbow of the seal. Contact point 262 is horizontally displaced from contact point 264. Contact point 262 extends above an upper surface of a remainder of the seal, and contact point 264 extends below a bottom surface of a remainder of the seal.

As will be explained in greater detail in FIG. 4, contact point 262 can engage with the load port door and contact point 264 can engage with the face of the substrate carrier. In particular, when in the closed position, the load port door can engage with contact point 262 by applying pressure to contact point 262. By applying pressure, the load point door and contact point 262 can form an airtight seal to maintain an environmentally-controlled atmosphere within the factory interface 106. On the opposite side, the face of the substrate carrier can engage with contact point 264 by applying pressure to contact point 264. By applying pressure, the substrate carrier can form an airtight seal to maintain an environmentally-controlled atmosphere within the factory interface 106 when the load port door is in the open position.

Figure 3A:
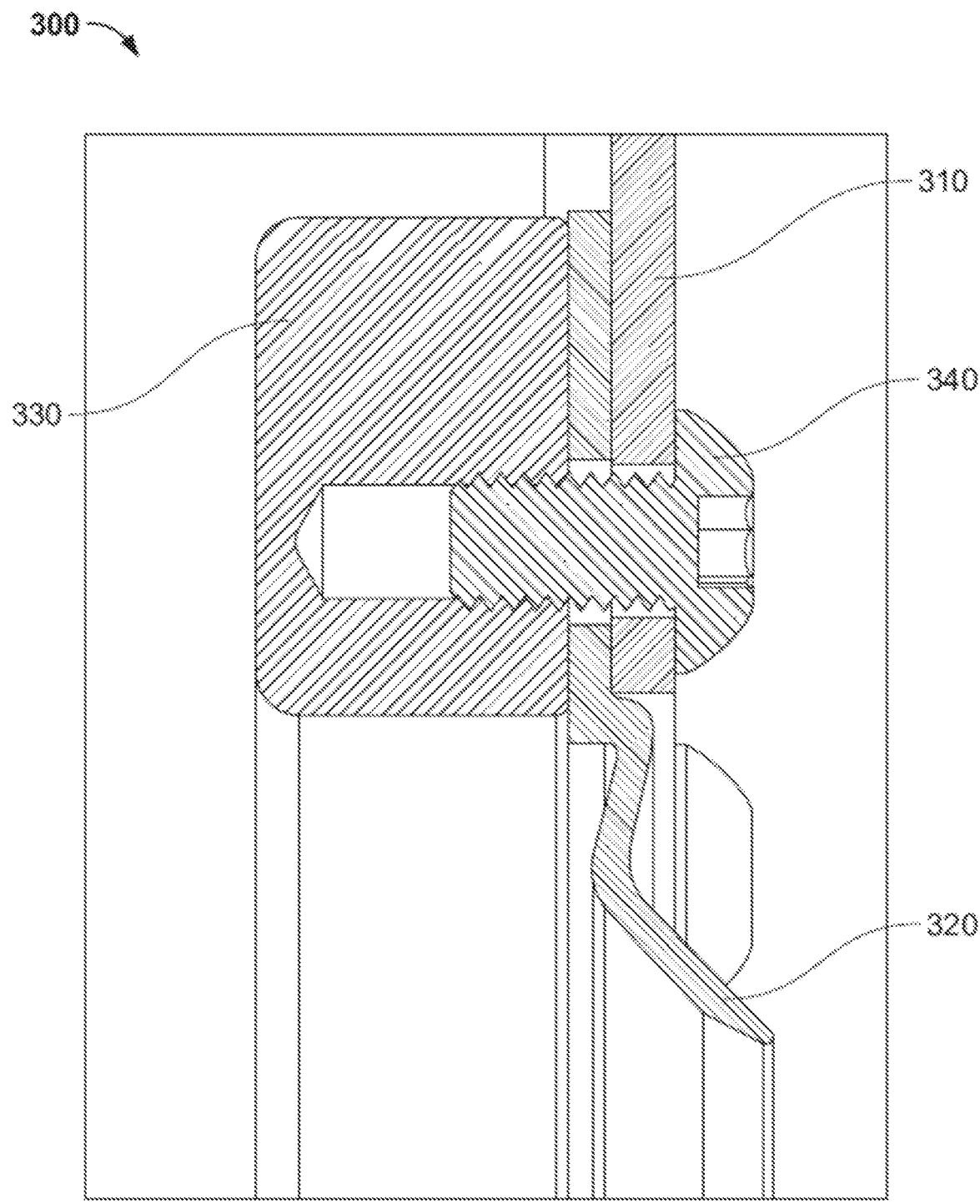
FIG. 3A is a side schematic view of another example load port frame and seal assembly, according to aspects of the present disclosure.
Figure 3B:
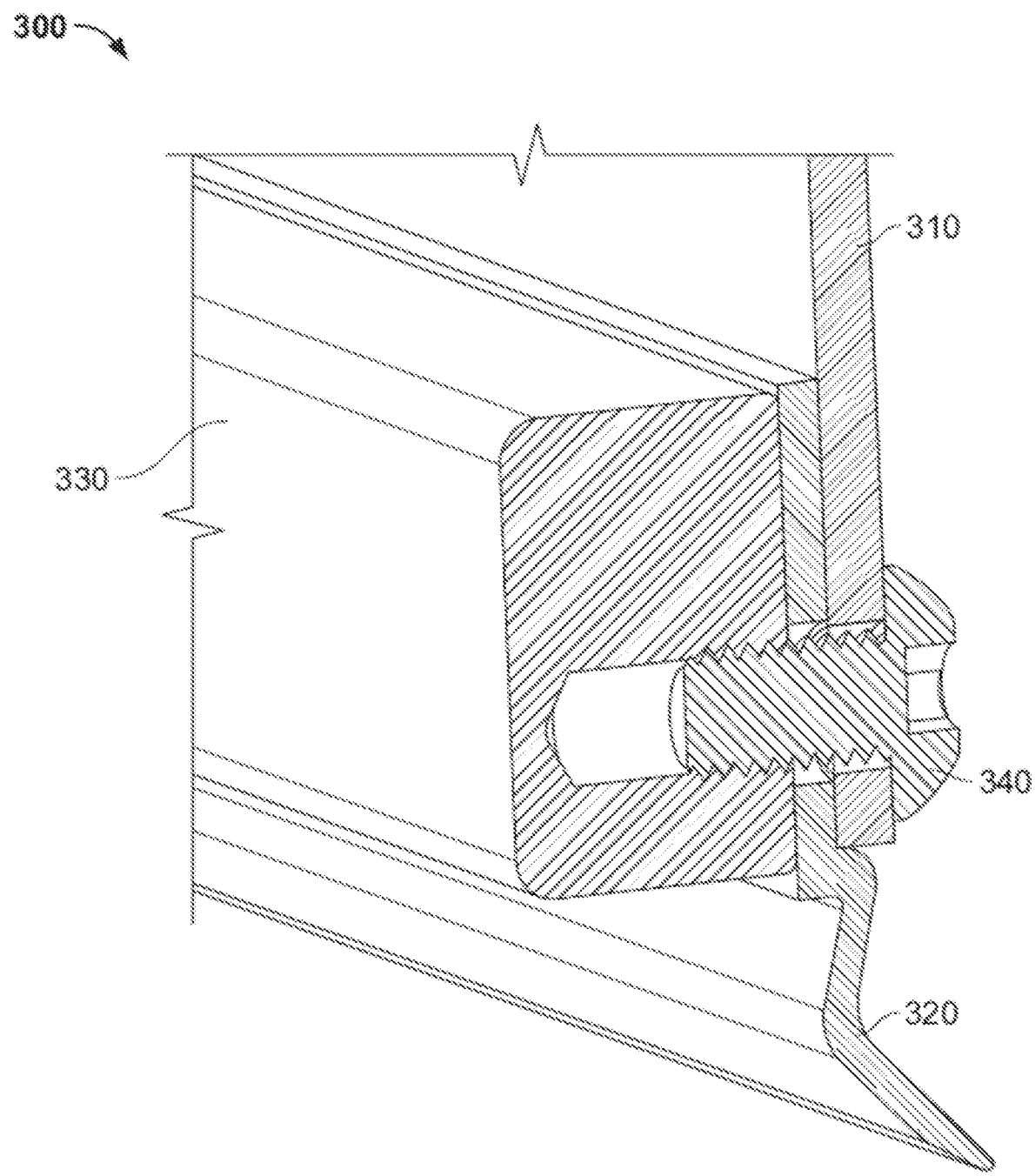
FIG. 3B is a perspective schematic view of another example load port frame and seal assembly, according to aspects of the present disclosure.

FIGS. 3A and 3B illustrate another example load port frame and seal assembly 300, in accordance with embodiments of the present disclosure. FIG. 3A is a side view of the assembly 300. FIG. 3B is a perspective schematic view of the assembly 300. The assembly 300 includes load port frame 310, seal 320, coupling 330, and fastener 340. As shown, assembly 300 illustrates a different configuration from assembly 200. In particular, seal 320 is positioned between load port frame 310 and coupling 330. Multiple fasteners 340 can be used to apply compressive pressure to secure the load port frame 310 to the seal 320 and the coupling 330. Fastener 340 can include one or more bolts, screws, rivets, or any other type of fastener.

Figure 4A:
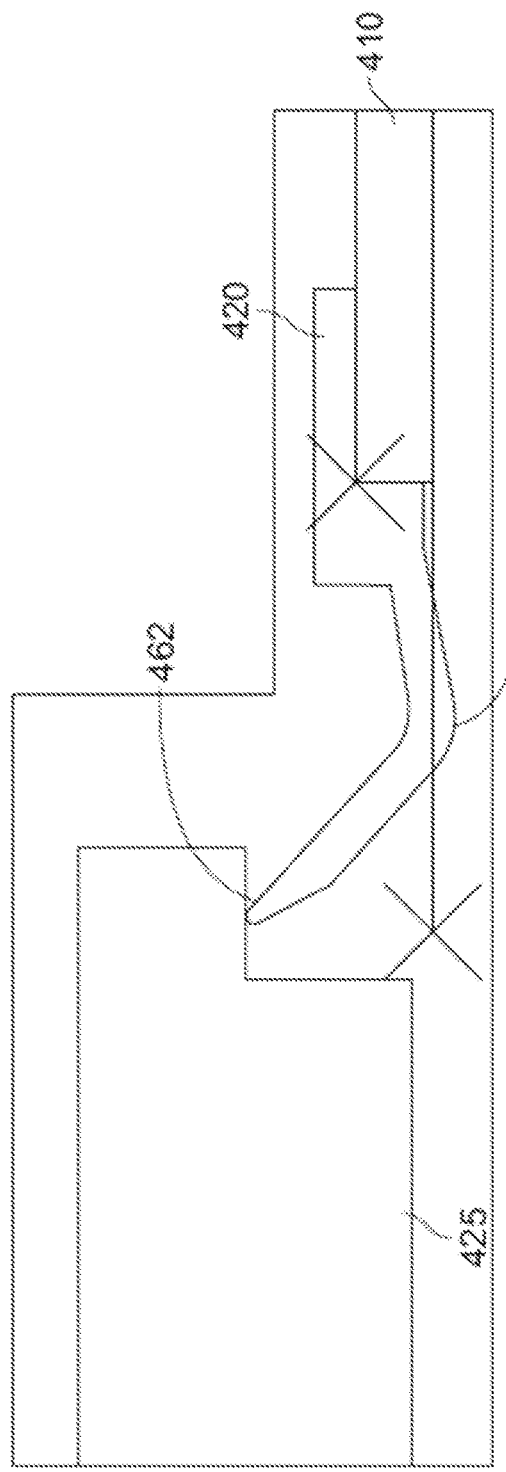
FIGS. 4A-4D are diagrams illustrating the seal of the present disclosure during different operational configurations of the electronic device manufacturing system, according to aspects of the present disclosure.
Figure 4B:
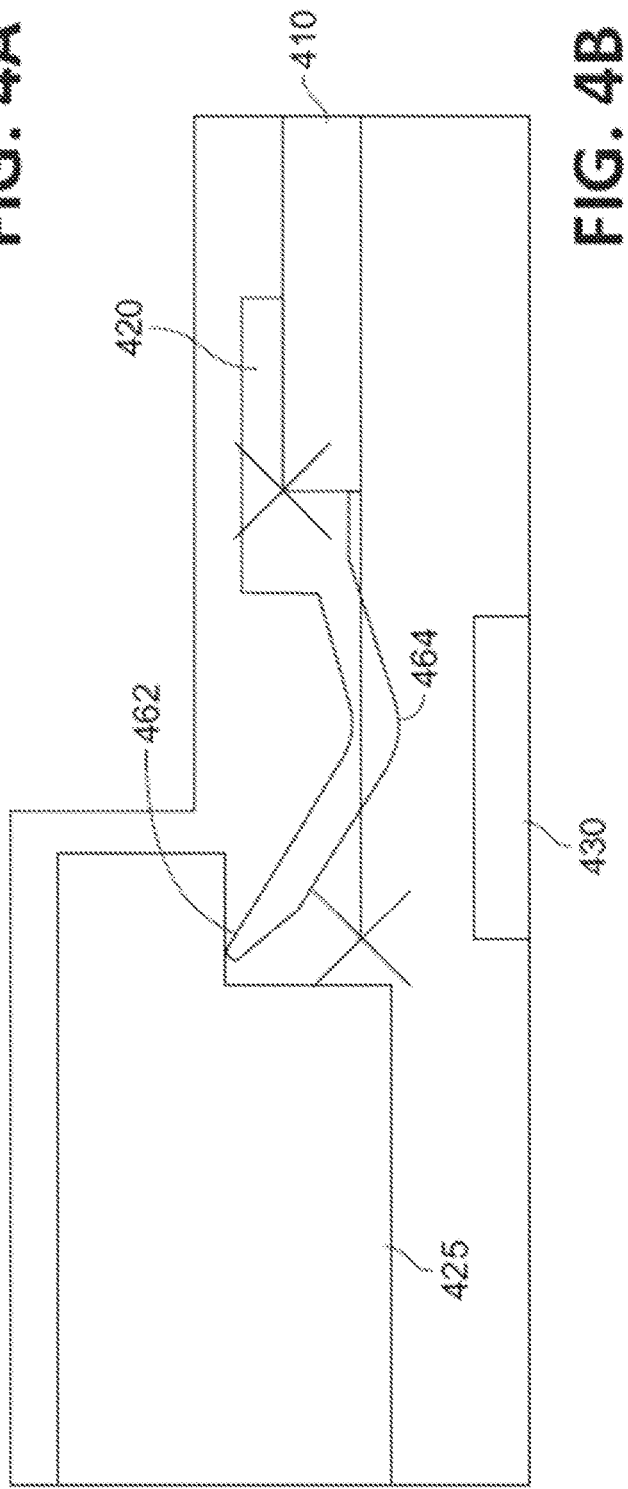
Figure 4C:
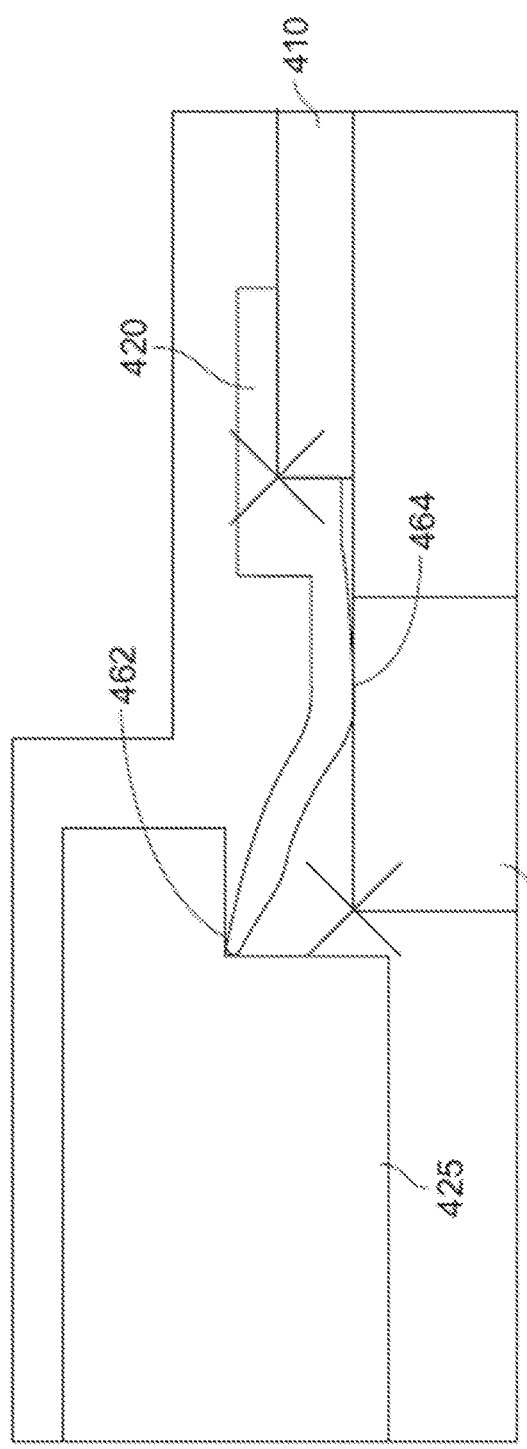
Figure 4D:
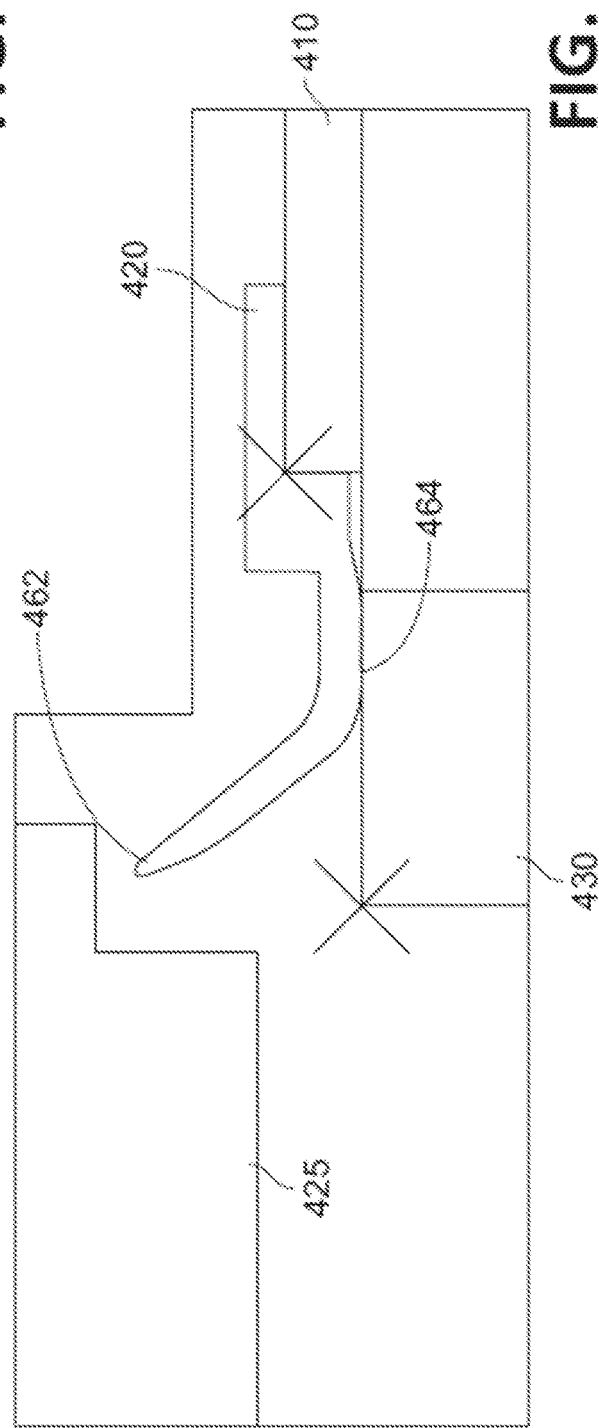

FIGS. 4A-4D are diagrams illustrating the seal of the present disclosure during different operational configurations of the electronic device manufacturing system, in accordance with embodiments of the present disclosure. In FIGS. 4A-4D, seal 420 is coupled to load port frame 410. Seal 420 includes contact point 462 and contact point 464. FIG. 4A illustrates a configuration where seal 420 is in a resting position. In particular, neither load port door 425 nor substrate carrier 430 are applying pressure to seal 420. FIG. 4B illustrates a configuration where only load port door 425 is applying pressure to contact point 462. Thus, an airtight seal is formed between the seal 420 and the load port door 425. FIG. 4C illustrates a configuration where load port door 425 is applying pressure to contact point 462 and substrate carrier 430 is applying pressure to contact point 464. Thus, an airtight seal is formed between the seal 420 and the load port door 425, as well as between the seal 420 and the substrate carrier 430. FIG. 4D illustrates a configuration where only substrate carrier 430 is applying pressure to contact point 464. Thus, an airtight seal is formed between the seal 420 and the substrate carrier 430.

FIGS. 5A-5C illustrate another example of a load port frame and a seal assembly 500, in accordance with embodiments of the present disclosure. FIG. 5A is an isometric schematic view of assembly 500 and frame 510. FIG. 5B is a side schematic view of frame 510 and seal 520B. FIG. 5C is a front schematic view of frame 510 and seal 520B.

Assembly 500 can include seal 520A, seal 520B, coupling 550A, and coupling 550B. Assembly 500 can be included in load port frame 510. Seal 520A and seal 520B can be positioned around a transport opening (e.g., inner parameter of the load port frame 510). In particular, seal 520A can be positioned around the transport opening on the side of the load port frame 510 that interacts with the load port door 530. For example, seal 520A can contact, via a contact point, with the load port door 530 responsive to the load port door 530 being in the closed position. Seal 520B can be positioned around the transport opening on the side of the load port frame that interacts with the substrate carrier 122. For example, seal 520B can contact, via a contact point with the substrate carrier 122 responsive to the contact carrier 122 being in a docked position on the load port 124. In some embodiments, seal 520A and 520B can each be a single piece of material, such as, for example, vulcanized rubber or any other type of elastomer. Those skilled in the art would understand that other suitable materials can be used, such as, for example, natural rubbers, silicone, plastics, other synthetic rubbers, polymers, etc. In some embodiments, seal 520A-520B can be composed of multiple components coupled together.

Coupling 550A-B can be any type of connection device or mechanism used to couple seal 520A-B, respectively, to load port frame 510. Coupling 550A-B can span the perimeter of load port frame 510. Coupling 550A-B can be affixed to load port frame 510 via one or more bolts, screws, rivets, or any other type of fastener. For example, coupling 550A-B can be affixed to the load port frame 510 using multiple bolts inserted through drilled holes in the load port frame 510 and into respective bores. In some embodiments, coupling 550A-B can be welded, fused, bonded, etc. to load port frame 510. As illustrated, coupling 550A is affixed to the load port frame 510 on the factory interface side of the load port frame 510, and coupling 550B can be affixed to the load port frame 510 on the opposite side (substrate carrier docking side) of load port frame 510.

In some embodiments seal 520A-B is designed in a "bent line" shape, where the top portion of seal 520A-B is coupled to the load port frame 510, the lower portion of the seal 520A is configured to engage with the load port door 530, the lower portion of seal 520B is configured to engage with the substrate carrier 122, and where the angle between the top portion and the lower portion of seal 520A-B is less than 180° and greater than 90°. In some embodiments, the top portion and the lower portion of seal 520A-B can be approximately similar in length.

FIGS. 6A-6C illustrate another example of a load port frame and a seal assembly 600, in accordance with embodiments of the present disclosure. FIG. 6A is an isometric schematic view of assembly 600 and frame 610. FIG. 6B is a side schematic view of frame 610 and seal 620. FIG. 6C is a front schematic view of frame 610 and seal 620.

Assembly 600 can include seal 620A, seal 620B, coupling 650A, and coupling 650B. Assembly 600 can be included in load port frame 610. Seal 620A and seal 620B can be positioned around a transport opening (e.g., inner parameter of the load port frame 610). In particular, seal 620A can be positioned around the transport opening on the side of the load port frame 610 that interacts with the load port door 630. For example, seal 620A can contact, via a contact point, with the load port door 630 responsive to the load port door 630 being in the closed position. Seal 620B can be positioned around the transport opening on the side of the load port frame that interacts with the substrate carrier 122. For example, seal 620B can contact, via a contact point, with the substrate carrier 122 responsive to the contact carrier 122 being in a docked position on the load port 124. In some embodiments, seal 620A and 620B can each be a single piece of material, such as, for example, vulcanized rubber or any other type of elastomer. Those skilled in the art would understand that other suitable materials can be used, such as, for example, natural rubbers, silicone, plastics, other synthetic rubbers, polymers, etc. In some embodiments, seal 620A-620B can be composed of multiple components coupled together.

Coupling 650A-B can be any type of connection device or mechanism used to couple seal 620A-B, respectively, to load port frame 610. Coupling 650A-B can span the perimeter of load port frame 610. Coupling 650A-B can be affixed to load port frame 610 via one or more bolts, screws, rivets, or any other type of fastener. For example, coupling 650A-B can be affixed to the load port frame 610 using multiple bolts inserted through drilled holes in the load port frame 610 and into respective bores. In some embodiments, coupling 650A-B can be welded, fused, bonded, etc. to load port frame 610. As illustrated, coupling 650A is affixed to the load port frame 610 on the factory interface side of the load port frame 610, and coupling 650B can be affixed to the load port frame 610 on the opposite side (substrate carrier docking side) of load port frame 610.

In some embodiments seal 620A-B is designed in a "bent line" shape, where the top portion of seal 620A-B is coupled to the load port frame 610, the lower portion of the seal 620A is configured to engage with the load port door, the lower portion of seal 620B is configured to engage with the substrate carrier 122, and where an angle between the top portion and the lower portion of seal 620A-B is less than 180° and greater than 90°. In some embodiments, the lower portion can be shorter than the upper portion of 620A-B.

FIGS. 7A-7C illustrate another example of a load port frame and a seal assembly 700, in accordance with embodiments of the present disclosure. FIG. 7A is an isometric schematic view of assembly 700 and frame 710. FIG. 7B is a side schematic view of seal 720A. FIG. 7C is a front schematic view of seal 720A.

Assembly 700 can include seal 720A, seal 720B, and coupling 750. Assembly 700 can be included in load port frame 710. Seal 720A and seal 720B can be positioned around a transport opening (e.g., inner parameter of the load port frame 710). In particular, seal 720A can be positioned around the transport opening on the side of the load port frame 710 that interacts with the load port door 730. For example, seal 720A can contact, via a contact point, with the load port door 730 responsive to the load port door 730 being in the closed position. Seal 720B can be positioned around the transport opening on the side of the load port frame that interacts with the substrate carrier 122. For example, seal 720B can contact, via a contact point, with the substrate carrier 122 (not shown) responsive to the contact carrier 122 being in a docked position on the load port 124. In some embodiments, seal 720B can be similar to seal 520B. In some embodiments, seal 720A and 720B can each be a single piece of material, such as, for example, vulcanized rubber or any other type of elastomer. Those skilled in the art would understand that other suitable materials can be used, such as, for example, natural rubbers, silicone, plastics, other synthetic rubbers, polymers, etc. In some embodiments, seal 720A-720B can be composed of multiple components coupled together.

Seal 720A can be welded, fused, bonded, etc. to load port frame 710. As illustrated, seal 720A is affixed to the load port frame 710 on the load port door 730 side of load port frame 710. In some embodiments, seal 720A can be affixed to the load port frame 710 via one or more bolts, screws, rivets, or any other type of fastener.

Coupling 750 can be any type of connection device or mechanism used to couple seal 720B to load port frame 710. Coupling 750 can span the perimeter of load port frame 710. Coupling 750 can be affixed to load port frame 710 via one or more bolts, screws, rivets, or any other type of fastener. For example, coupling 750 can be affixed to the load port frame 710 using multiple bolts inserted through drilled holes in the load port frame 710 and into respective bores. In some embodiments, coupling 750 can be welded, fused, bonded, etc. to load port frame 710. As illustrated, coupling 750 is affixed to the load port frame 710 on the substrate carrier docking side of load port frame 710.

In some embodiments seal 720A is designed in a "V" shape, when a first side of seal 720A is coupled to the load port frame 710, a second side of the seal 720A is configured to engage with the load port door, and where an angle between the first side and the second side of seal 720A is less than 90° and greater than 0°. In some embodiments, the first side and the second side of seal 720A can be approximately similar in length.

FIGS. 8A-8C illustrate another example of a load port frame and a seal assembly 800, in accordance with embodiments of the present disclosure. FIG. 8A is an isometric schematic view of assembly 800 and frame 810. FIG. 8B is a side schematic view of seal 820A. FIG. 8C is a front schematic view of seal 820A.

Assembly 800 can include seal 820A, seal 820B, and coupling 850. Assembly 800 can be included in load port frame 810. Seal 820A can be affixed to load port door 830. In particular, seal 820A can be positioned around the face of the load port door 830 such that seal 820A can interact with load port frame 810 responsive to load port door 830 being in a closed position. Seal 820B can be positioned around a transport opening (e.g., inner parameter of the load port frame 810). Seal 820B can be positioned around the transport opening on the side of the load port frame that interacts with the substrate carrier 122. For example, seal 820B can contact, via a contact point, with the substrate carrier 122 (not shown) responsive to the contact carrier 122 being in a docked position on the load port 124. In some embodiments, seal 820B can be similar to seal 520B. In some embodiments, seal 820A and 820B can each be a single piece of material, such as, for example, vulcanized rubber or any other type of elastomer. Those skilled in the art would understand that other suitable materials can be used, such as, for example, natural rubbers, silicone, plastics, other synthetic rubbers, polymers, etc. In some embodiments, seal 820A-820B can be composed of multiple components coupled together.

Seal 820A can be welded, fused, bonded, etc. to lord port door 830. As illustrated, seal 820A is affixed to the load port door 830. In some embodiments, seal 820A can be affixed to the load port door 830 via one or more bolts, screws, rivets, or any other type of fastener.

Coupling 850 can be any type of connection device or mechanism used to couple seal 820B to load port frame 810. Coupling 850 can span the perimeter of load port frame 810. Coupling 850 can be affixed to load port frame 810 via one or more bolts, screws, rivets, or any other type of fastener. For example, coupling 850 can be affixed to the load port frame 810 using multiple bolts inserted through drilled holes in the load port frame 810 and into respective bores. In some embodiments, coupling 850 can be welded, fused, bonded, etc. to load port frame 810. As illustrated, coupling 850 is affixed to the load port frame 810 on the substrate carrier docking side of load port frame 810.

In some embodiments seal 820A is designed in a "V" shape, when a first side of seal 820A is coupled to the load port frame 810, a second side of the seal 820A is configured to engage with the load port door, and where an angle between the first side and the second side of seal 820A is less than 90° and greater than 0°. In some embodiments, the first side of seal 820A may be shorter than the second side or vice versa.

FIGS. 9A-9C illustrate another example of a load port frame and a seal assembly 900, in accordance with embodiments of the present disclosure. FIG. 9A is an isometric schematic view of assembly 900 and frame 910. FIG. 9B is a side schematic view of seal 920A. FIG. 9C is a front schematic view of seal 920A.

Assembly 900 can include seal 920A, seal 920B, and coupling 950. Assembly 900 can be included in load port frame 910. Seal 920A can be affixed to load port door 930. In particular, seal 920A can be positioned around the face of the load port door 930 such that seal 920A can interact with load port frame 910 responsive to load port door 930 being in a closed position. Seal 920B can be positioned around a transport opening (e.g., inner parameter of the load port frame 910). Seal 920B can be positioned around the transport opening on the side of the load port frame that interacts with the substrate carrier 122. For example, seal 920B can contact, via a contact point, with the substrate carrier 122 (not shown) responsive to the contact carrier 122 being in a docked position on the load port 124. In some embodiments, seal 920B can be similar to seal 520B. In some embodiments, seal 920A and 920B can each be a single piece of material, such as, for example, vulcanized rubber or any other type of elastomer. Those skilled in the art would understand that other suitable materials can be used, such as, for example, natural rubbers, silicone, plastics, other synthetic rubbers, polymers, etc. In some embodiments, seal 920A-920B can be composed of multiple components coupled together.

Seal 920A includes protrusion 922 and sealing component 924. In some embodiments, protrusion 922 can be any insertable, expanding or mushroom shape (e.g., a dovetail joint, one or more pins, etc.) capable of being inserted into a notch or cavity in the load port door 930. In some embodiments, protrusion 922 can apply pressure to the notch or cavity in load port door 930 to remain affixed. In some embodiments, protrusion 922 can be welded, fused, bonded, etc. to load port door 930. In some embodiments, seal 920A can be affixed to load port door 930 via one or more bolts, screws, rivets, or any other type of fastener. Seal 920A can further include sealing component 924. Sealing component 924 can provide a seal when the load port door 930 is in the closed position.

Coupling 950 can be any type of connection device or mechanism used to couple seal 920B to load port frame 910. Coupling 950 can span the perimeter of load port frame 910. Coupling 950 can be affixed to load port frame 910 via one or more bolts, screws, rivets, or any other type of fastener. For example, coupling 950 can be affixed to the load port frame 910 using multiple bolts inserted through drilled holes in the load port frame 910 and into respective bores. In some embodiments, coupling 950 can be welded, fused, bonded, etc. to load port frame 910. As illustrated, coupling 950 is affixed to the load port frame 910 on the substrate carrier docking side of load port frame 910.

Figure 10:
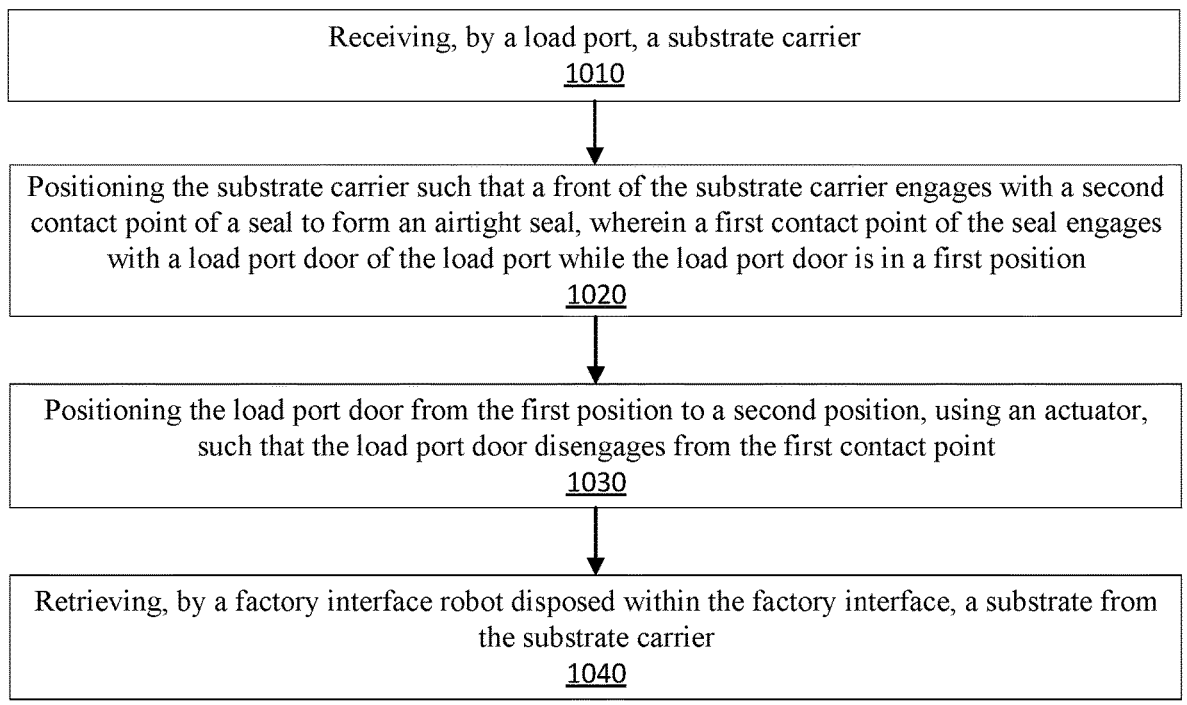
FIG. 10 is a method for method for transporting substrates from a substrate carrier to a factory interface, in accordance with embodiments of the present disclosure.

FIG. 10 is a method 1000 for transporting substrates from a substrate carrier to a factory interface, in accordance with embodiments of the present disclosure. At block 1010, a load port receives a substrate carrier. In an example, the substrate carrier is a FOUP. In some embodiments, the load port includes a frame adapted for connecting the load port to the factory interface. The frame includes a transport opening through which one or more substrates are capable of being transported between the substrate carrier and the factory interface. The load port also includes an actuator coupled to the frame and a load port door coupled to the actuator. The load port door can be configured to seal the transport opening. The actuator is capable of positioning the load port door from a closed position to an open position, and from the open position to the closed position The load port can further include one or more seals coupled to the frame. A seal can include a first contact point configured to engage with a load port door when the load port door is in a first position, and configured to disengage with the load port door when the load port door is in a second position. The same seal or a second seal can include a second contact point configured to engage with a front of a substrate carrier when the substrate carrier is coupled to the load port.

At block 1020, the substrate carrier can be positioned such that a front of the substrate carrier engages with the second contact point to form an airtight seal.

At block 1030, the load port door can be positioned from the first position to the second position, using an actuator, such that the load port door disengages from the first contact point.

At block 1040, a factory interface robot disposed within the factory interface retrieves a substrate from the substrate carrier. Once the substrates are retrieved, the load port door can be positioned from the second position to the first position, using the actuator, such that the load port door engages the first contact point to form an airtight seal. The substrate carrier can then be disengaged.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A load port for receiving a substrate carrier, comprising:
a frame adapted for connecting the load port to a factory interface, the frame comprising a transport opening through which one or more substrates are transported between the substrate carrier and the factory interface; and
a seal coupled to the frame, wherein the seal comprises:
an outer portion configured to be coupled to the frame;
an inner portion comprising a first contact point configured to engage with a load port door when the load port door is in a first position, and configured to disengage with the load port door when the load port door is in a second position wherein the inner portion is on a side exterior to a plane formed by an outer face of the frame; and
a middle portion comprising a second contact point configured to engage with a front of the substrate carrier when the substrate carrier is docked on the load port.

2. The load port of claim 1, further comprising a coupling, wherein the seal comprises a protrusion capable of being inserted into a notch in the coupling.

3. The load port of claim 2, wherein the coupling is affixed to the frame using at least one of a plurality of bolts, a plurality of screws, or a plurality of rivets.

4. The load port of claim 2, wherein the coupling is at least one of welded, fused, or bonded to the frame.

5. The load port of claim 1, further comprising a coupling, wherein the seal is positioned between the coupling and the frame.

6. The load port of claim 1, wherein the seal is comprised of an elastomer.

7. The load port of claim 1, wherein an airtight seal along a perimeter of the seal is formed responsive to the first contact point being engaged with the load port door when the load port door is in the first position.

8. The load port of claim 1, wherein an airtight seal along a perimeter of the seal is formed responsive to the second contact point being engaged with a face of the substrate carrier when the substrate carrier is docked on the load port.

9. The load port of claim 1, wherein the seal is simultaneously engaged with the load port door via the first contact point and with a face of the substrate carrier via the second contact point.

10. A load port for receiving a substrate carrier, comprising:
a frame adapted for connecting the load port to a factory interface, the frame comprising a transport opening through which one or more substrates are transported between the substrate carrier and the factory interface;
a first seal coupled to a first side of the frame, wherein the first seal comprises a first contact point configured to engage with a load port door when the load port door is in a first position, and configured to disengage with the load port door when the load port door is in a second position; and
a second seal coupled to a second side of the frame opposite of the first side, wherein the second seal comprises a second contact point configured to engage with a front of the substrate carrier when the substrate carrier is docked on the load port.

11. The load port of claim 10, further comprising a coupling configured to affix at least one of the first seal or the second seal to the frame using at least one of a plurality of bolts, a plurality of screws, or a plurality of rivets.

12. The load port of claim 10, wherein at least one of the first seal or the second seal is at least one of welded, fused, or bonded to the frame.

13. The load port of claim 10, wherein at least one of the first seal or the second seal is comprised of an elastomer.

14. The load port of claim 10, wherein an airtight seal along a perimeter of the first seal is formed responsive to the first contact point being engaged with the load port door when the load port door is in the first position, and an airtight seal along a perimeter of the second seal is formed responsive to the second contact point being engaged with a face of the substrate carrier when the substrate carrier is docked on the load port.

15. A load port for receiving a substrate carrier, comprising:
a frame adapted for connecting the load port to a factory interface, the frame comprising a transport opening through which one or more substrates are transported between the substrate carrier and the factory interface;
a first seal coupled to a load port door, wherein the first seal comprises a first contact point configured to engage with the frame when the load port door is in a first position, and configured to disengage with the frame when the load port door is in a second position; and
a second seal coupled to the frame, wherein the second seal comprises a second contact point configured to engage with a front of the substrate carrier when the substrate carrier is docked on the load port.

16. The load port of claim 15, wherein the first seal comprises a protrusion that is affixed to a notch in the load port door.

17. The load port of claim 15, further comprising a coupling configured to affix the second seal to the frame using at least one of a plurality of bolts, a plurality of screws, or a plurality of rivets.

18. The load port of claim 15, wherein the second seal is at least one of welded, fused, or bonded to the frame.

19. A seal for a load port, comprising:
- a outer portion adapted for connecting to a frame of the load port;
- a middle portion comprising a first contact point, wherein the first contact point is at a bend of the seal and configured to engage with a face of a substrate carrier; and
- an inner portion comprising a second contact point, wherein the second contact point is an outer edge of the seal configured to engage with a load port door of the load port, wherein the inner portion is on a side exterior to a plane formed by an outer face of the frame.

\* \* \* \* \*